US008361822B2

(12) United States Patent
Saeki (10) Patent No.: US 8,361,822 B2
(45) Date of Patent: Jan. 29, 2013

(54) LIGHT-EMITTING DEVICE AND METHOD FOR PRODUCING LIGHT EMITTING DEVICE

(75) Inventor: Ryo Saeki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,114

(22) Filed: Mar. 16, 2012

(65) Prior Publication Data

US 2012/0175590 A1  Jul. 12, 2012

Related U.S. Application Data

(62) Division of application No. 13/276,497, filed on Oct. 19, 2011, now Pat. No. 8,148,714, and a division of application No. 12/326,538, filed on Dec. 2, 2008, now Pat. No. 8,076,168.

(30) Foreign Application Priority Data

Dec. 6, 2007  (JP) ................................. 2007-315436

(51) Int. Cl.
*H01L 21/20* (2006.01)
*H01L 21/46* (2006.01)
*H01L 33/00* (2010.01)
*H01S 5/00* (2006.01)

(52) U.S. Cl. .... 438/46; 438/459; 438/977; 257/E21.088

(58) Field of Classification Search ................... 438/22, 438/46, 459, 977; 257/E21.088
See application file for complete search history.

(56) References Cited

U.S. PATENT DOCUMENTS

| | | | |
|---|---|---|---|
| 6,455,398 B1 | 9/2002 | Fonstad, Jr. et al. | |
| 6,548,834 B2 * | 4/2003 | Sugawara et al. ............... 257/90 |
| 6,887,770 B2 | 5/2005 | Ueda et al. | |
| 6,913,985 B2 | 7/2005 | Ogihara et al. | |
| 7,105,857 B2 | 9/2006 | Nagahama et al. | |
| 7,141,445 B2 * | 11/2006 | Sugawara et al. ............... 438/41 |
| 7,180,093 B2 | 2/2007 | Takayama et al. | |
| 7,335,573 B2 | 2/2008 | Takayama et al. | |
| 7,364,954 B2 | 4/2008 | Kuwashima et al. | |
| 7,368,310 B2 | 5/2008 | Akita | |
| 7,427,526 B2 | 9/2008 | Fonash et al. | |
| 7,560,322 B2 | 7/2009 | Clarke et al. | |
| 7,564,069 B2 | 7/2009 | Shei | |
| 7,601,217 B2 | 10/2009 | Faure et al. | |
| 7,615,468 B2 | 11/2009 | Boussagol et al. | |
| 7,622,361 B2 | 11/2009 | Goto et al. | |

(Continued)

FOREIGN PATENT DOCUMENTS

| | | |
|---|---|---|
| JP | 2000-260760 | 9/2000 |
| JP | 2006-093358 | 4/2006 |

(Continued)

OTHER PUBLICATIONS

United States Office Action corresponding to U.S. Appl. No. 12/326,538 mailed on Feb. 15, 2011.

(Continued)

*Primary Examiner* — Mary Wilczewski
(74) *Attorney, Agent, or Firm* — Turocy & Watson, LLP (57) ABSTRACT

A method for producing a light-emitting device, includes: performing, on a first substrate made of III-V group compound semiconductor, crystal growth of a laminated body including an etching easy layer contiguous to the first substrate and a light-emitting layer made of nitride semiconductor; bonding a second substrate and the laminated body; and detaching the second substrate provided with the light-emitting layer from the first substrate by, one of removing the etching easy layer by using a solution etching method, and removing the first substrate and the etching easy layer by using mechanical polishing method.

12 Claims, 6 Drawing Sheets

U.S. PATENT DOCUMENTS

| | | |
|---|---|---|
| 7,696,058 B2 | 4/2010 | Kakehata et al. |
| 7,741,642 B2 | 6/2010 | Takayama et al. |
| 7,776,637 B2 | 8/2010 | Leem |
| 7,826,512 B2 * | 11/2010 | Ueda et al. .................. 372/87 |
| 7,839,001 B2 | 11/2010 | Boussagol et al. |
| 7,858,411 B2 | 12/2010 | Yamazaki et al. |
| 7,858,495 B2 | 12/2010 | Ohnuma et al. |
| 8,076,168 B2 * | 12/2011 | Saeki ............................ 438/46 |
| 8,110,451 B2 * | 2/2012 | Akaike et al. ................. 438/143 |
| 8,148,714 B2 * | 4/2012 | Saeki ............................ 257/13 |
| 2001/0024837 A1 | 9/2001 | Streubel |
| 2002/0197825 A1 | 12/2002 | Usui et al. |
| 2003/0064569 A1 | 4/2003 | Takayama et al. |
| 2003/0082889 A1 | 5/2003 | Maruyama et al. |
| 2003/0219959 A1 | 11/2003 | Ghyselen et al. |
| 2004/0110395 A1 | 6/2004 | Ueda et al. |
| 2004/0232459 A1 | 11/2004 | Takayama et al. |
| 2005/0026394 A1 | 2/2005 | Letertre et al. |
| 2005/0208691 A1 | 9/2005 | Shei et al. |
| 2006/0051937 A1 | 3/2006 | Ploessl et al. |
| 2006/0057817 A1 | 3/2006 | Sonoda et al. |
| 2006/0102933 A1 | 5/2006 | Yamamoto |
| 2007/0109735 A1 | 5/2007 | Yamazaki et al. |
| 2007/0134834 A1 | 6/2007 | Lee et al. |
| 2007/0290203 A1 | 12/2007 | Saeki |
| 2008/0049437 A1 | 2/2008 | Takayama et al. |
| 2008/0219309 A1 | 9/2008 | Hata et al. |
| 2009/0147813 A1 | 6/2009 | Saeki |
| 2010/0195033 A1 | 8/2010 | Takayama et al. |

FOREIGN PATENT DOCUMENTS

| | | | |
|---|---|---|---|
| JP | 2006-135026 | | 5/2006 |
| JP | 2009-141093 | * | 6/2009 |

OTHER PUBLICATIONS

Japanese Office Action for Japanese Application No. 2007-315436 mailed Mar. 2, 2012.

* cited by examiner

LIGHT-EMITTING DEVICE AND METHOD FOR PRODUCING LIGHT EMITTING DEVICE

CROSS-REFERENCE TO RELATED APPLICATIONS

This application is a Division of application Ser. No. 13/276,497 filed Oct. 19, 2011, which is a Division of application Ser. No. 12/326,538 filed Dec. 2, 2008, the entire contents of both of which are incorporated herein by reference.

This application is based upon and claims the benefit of priority from the prior Japanese Patent Application No. 2007-315436, filed on Dec. 6, 2007; the entire contents of which are incorporated herein by reference.

BACKGROUND OF THE INVENTION

1. Field of the Invention

This invention relates to a light-emitting device and a method for producing a light-emitting device.

2. Background Art

By improvement of characteristics of nitride light-emitting device, light equipment using a semiconductor light-emitting device has become possible. For further expanding lighting purpose, improvement of optical output and light-emitting efficiency of the light emitting device has been required. Moreover, in lighting purpose, high mass productivity is required.

As a substrate for performing crystal growth of a nitride light-emitting device, sapphire of insulator material or the like is often used. However, if an insulator substrate, it is difficult to set the vertical direction to the substrate to be a current pathway, and its current pathway becomes through high serial resistance along a surface parallel to the substrate. Therefore, the light-emitting efficiency lowers. On the other hand, if the nitride semiconductor substrate having conductivity is used, low resistance is possible but growth in size of the substrate is difficult and mass productivity is insufficient.

There is a technique disclosure example about a III-V group compound semiconductor device having high light-emitting efficiency and a method for producing the device (JP-A 2006-135026 (Kokai)). In this disclosure example, there is disclosed a method for producing a light-emitting device, including bonding a ground substrate in which a laminated body of III-V group compound semiconductor is formed and a semiconductor substrate in which a laminated body containing metal layer is formed and then removing the ground substrate.

However, even if the technique disclosure example is used, it is not sufficient for the light-emitting device and the producing method which have characteristics and mass productivity satisfying requirement of light purpose.

SUMMARY OF THE INVENTION

According to an aspect of the invention, there is provided a method for producing a light-emitting device, including: performing, on a first substrate made of III-V group compound semiconductor, crystal growth of a laminated body including an etching easy layer contiguous to the first substrate and a light-emitting layer made of nitride semiconductor; bonding a second substrate and the laminated body; and detaching the second substrate provided with the light-emitting layer from the first substrate by, one of removing the etching easy layer by using a solution etching method, and removing the first substrate and the etching easy layer by using mechanical polishing method.

According to another aspect of the invention, there is provided a method for producing a light-emitting device, including: performing, on a first substrate made of III-V group compound semiconductor, crystal growth of a laminated body including an etching easy layer contiguous to the first substrate and a light-emitting layer made of nitride semiconductor; bonding a second substrate and the laminated body; detaching the second substrate provided with the light-emitting layer from the first substrate by, one of removing the etching easy layer by using a solution etching method, and removing the first substrate and the etching easy layer by using mechanical polishing method; bonding one surface of the laminated body in a side in which the etching easy layer is removed to a third substrate; detaching the other surface of the laminated body bonded to the third substrate from the second substrate and bonding the other surface to a fourth substrate having conductivity; and detaching the one surface of the laminated body bonded to the fourth substrate from the third substrate.

According to an aspect of the invention, there is provided a light-emitting device including: a first laminated body in which, a laminated body made of III-V group compound semiconductor containing a light-emitting layer, a conductive transparent electrode, and a first metal layer, are sequentially provided; and a second laminated body having a semiconductor substrate and a second metal layer provided on the semiconductor substrate. The first metal layer and the second metal layer are bonded, and a radiant light from the light-emitting layer passes through the transparent electrode, are reflected by the first metal layer, and are taken out to the outside.

DETAILED DESCRIPTION OF THE INVENTION

Hereinafter, embodiments of this invention will be explained with reference to drawings.

Figure 1:
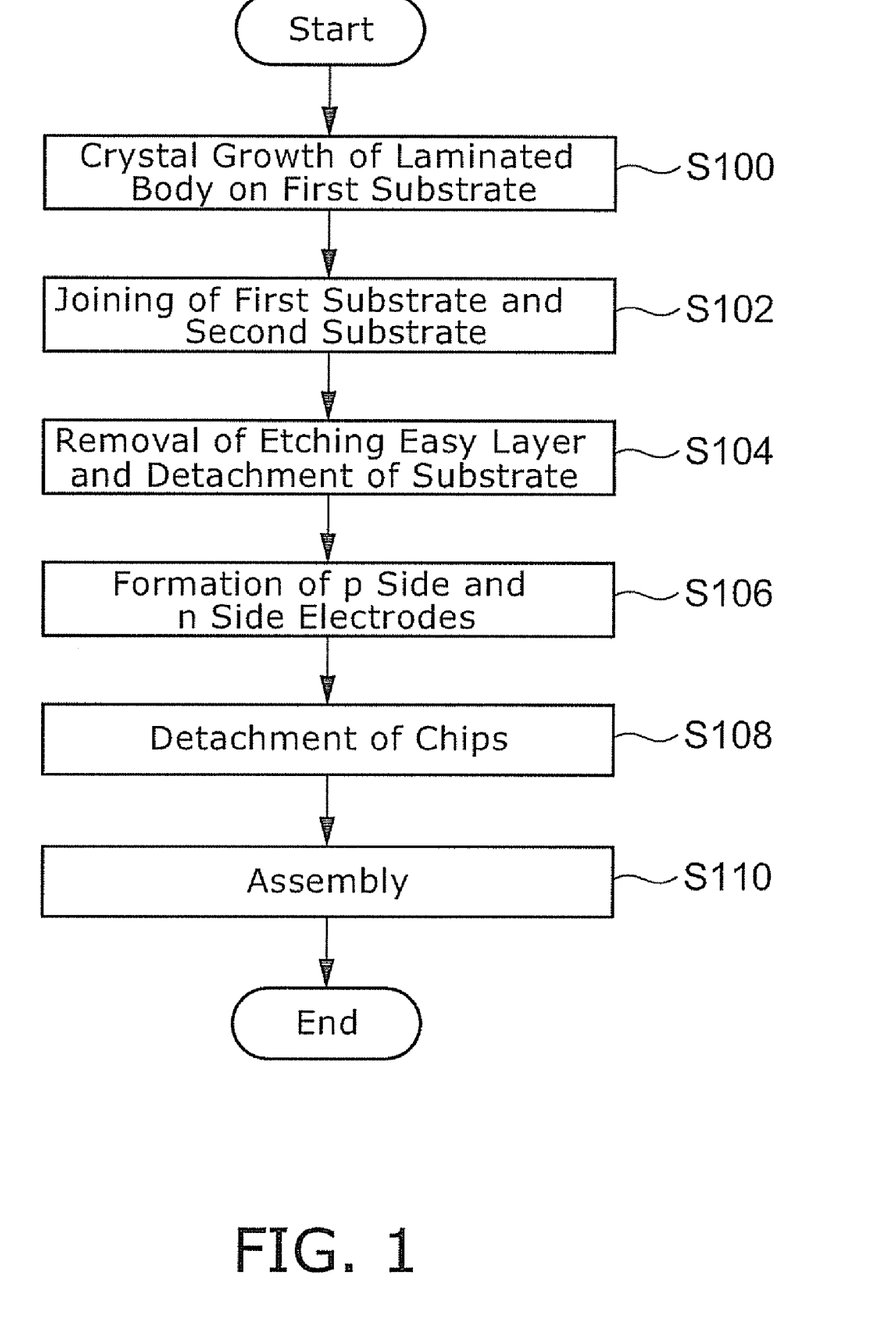
FIG. 1 is a flow chart of a method for producing a light-emitting device according to the invention.

FIG. 1 is a flow chart of a method for producing a light-emitting device according to this invention. Crystal growth of a laminated body including an etching easy layer and a light-emitting layer made of nitride semiconductor is performed on a first substrate made of GaP, GaAs, GaAlAs, or the like (S100). The laminated body has a structure of controlling spread of light to the vertical direction to the substrate by sandwiching the light-emitting layer by layers having different refractive indices therefrom, and crystal growth of such as structure is performed.

By opposing and bonding a surface of the laminated body and the second substrate, the first substrate and the second substrate are joined (S102). As the joining process, there is a method by using thermal treatment or adhesive sheet. Moreover, as the second substrate, a material such as Si or ZnO (zinc oxide) or sapphire is possible, or a material in which a metal layer provided thereon is possible.

Subsequently, by using a chemical etching method or a mechanical polishing method, the etching easy layer is removed and the first substrate and the second substrate are detached (S104). One electrode is formed on the laminated body, and the other electrode is formed on the back surface of the second substrate (S106).

Subsequently, dicing and chip detachment are performed (S108), the chip is mounted in a package, and electrical connection is performed by wire bonding, sealing is performed by using resin or the like, and thereby, the process is ended (S110).

As described above, in the method for producing a light-emitting device according to this embodiment, crystal growth of the nitride semiconductor is performed on such a substrate as GaP, GaAs, and GaAlAs, which have thermal expansion coefficients near to that of GaN. The thermal expansion coefficients are $5.9 \times 10^{-6}$/K in GaP and $6.0 \times 10^{-6}$/K in GaAs, which are near to $5.6 \times 10^{-6}$/K of GaN, and good crystal growth of nitride semiconductor is possible. That is, crack can be prevented from being generated in the crystal growth layer after the crystal growth, and warpage of the wafer can be reduced. By contrast, thermal expansion coefficients are $2.5 \times 10^{-6}$/K in Si, $4.2 \times 10^{-6}$/K in 6H—SiC, and $4.8 \times 10^{-6}$/K in ZnO, which are separate from GaN, and it is difficult for the substrates thereof to hold good crystallinity.

Moreover, both GaN and GaP are III-V group compound semiconductors and have crystal polarities dependent on the plane orientations. Therefore, in crystal growth of a GaN semiconductor, it is important to control such a crystal polarity as N plane or Ga plane to the growth direction. If a semiconductor having no crystal polarity such as sapphire is used as the substrate, it becomes difficult to control crystal polarity of the crystal growth film, and density of crystal defects is enhanced. By contrast, it is more preferable to use GaP because by appropriately selecting plane orientation, the control of crystal polarity becomes easy and the defect density is reduced and a light-emitting layer having better crystallinity can be formed.

Furthermore, for detaching the laminated body crystal-grown on the sapphire substrate from the sapphire substrate, a complex process such as melting a buffer layer such as GaN by irradiating a laser light thereto becomes required. By contrast, if III-V group compound semiconductor such as GaP substrate, GaAs substrate, or GaAlAs substrate is used, the detachment process can be simple by sandwiching a crystal growth layer that can be easily removed by a chemical etching method such as solution method. Moreover, because the crystal growth layer that is softer than the nitride semiconductor, the first substrate can be easily detached by a mechanical polishing method from the second substrate provided with the light-emitting layer.

On the other hand, the substrate made of nitride semiconductor has an extremely high melt point, and also, equilibrium vapor pressure of nitrogen is extremely high, and therefore, bulk crystal growth from the melt is difficult, and it is difficult to enlarge its diameter.

By contrast, according to a method for producing a light-emitting device of this embodiment, the light-emitting layer of good crystallinity is formed on a large-diameter substrate made of GaP or AlGaAs and bonded onto another conductive substrate, and the substrate used for crystal growth is detached. That is, the mass productivity is large.

FIG. 2A-2D are process sectional views of the method producing a light-emitting device according to the first embodiment. In the schematic view of FIG. 2A, on a GaP substrate (the first substrate) 20, there is formed a laminated body 39 in which sequential crystal growth of, an etching easy layer 22 (thickness: 0.5-several μm) made of at least any one of $Al_xGa_{1-x}P$ (0<x<1) and $In_xGa_{1-x}P$ (0<x<1) and $GaAs_xP_{1-x}$ (0<x<1), a GaP buffer layer 24, a GaN low-temperature growth buffer layer 26, an n-type GaN buffer layer 28, an n-type InGaAlN cladding layer 30 (thickness: 0.5-1.0 μm), a light-emitting layer 32 (thickness: 0.05-0.2 μm) made of InGaAlN MQW (Multi Quantum Well) layer, a p-type InGaAlN cladding layer 34 (thickness: 0.5-1.0 μm), a p-type GaN layer 36 (thickness: 0.1-0.4 μm), and a contact layer 38 made of $p^+$-type GaN.

As the crystal growth method, MOCVD (Metal-Organic Chemical Vapor Deposition) method, MBE (Molecular Beam Epitaxy) method, vapor growth method, liquid growth method, and so forth can be used.

Figure 2A:
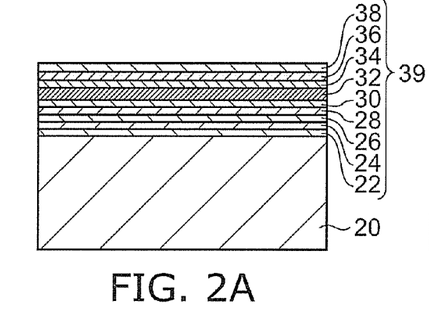
FIG. 2A-2D are process sectional views of the method producing a light-emitting device according to the first embodiment.

When the AlGaP etching easy layer 22 and the GaP buffer layer 24 are formed on the GaP substrate 20 by using the liquid growth method or the like, gas control system of GaP becomes needless in the MOCVD apparatus by which crystal growth of nitride semiconductor is performed. Moreover, in MOCVD method, GaP growth temperature is lower than 1000° C. and the growth temperature of the nitride semiconductor growth is higher than 1000° C. Therefore, when the AlGaP etching easy layer 22 and the GaP buffer layer 24 are formed by the liquid growth method, the MOCVD crystal growth temperature can be adapted for nitride semiconductor, and productivity can be enhanced. Of course, the laminated body 39 may be formed by MOCVD method or MBE method.

Figure 2B:
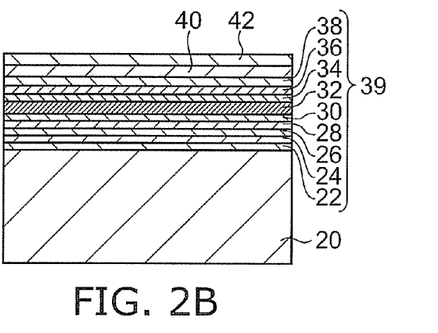

Moreover, as shown in FIG. 2B, on the contact layer 38, a transparent electrode 40 made of n-type ZnO or ITO (Indium Tin Oxide) or the like and an AuGe metal layer (first metal layer) 42 is further formed. In the first metal layer 42, Au metal layer may be formed contiguously to the transparent electrode 40 and an AuGe metal layer may be laminated thereon.

Figure 2C:
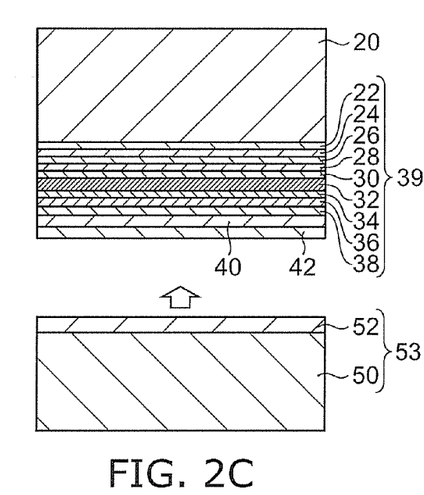

On the other hand, as shown in FIG. 2C, in the second substrate 50 made of n-type Si having about the same size as the first substrate 20, an Au metal layer (second metal layer) 52 is provided, and thereby, a second laminated body 53 is composed. Joining by bonding is performed by opposing the Au metal layer 52 and AuGe metal layer 42. The heat treatment condition of the junction is, for example, 500° C. for 1 hour. By further applying pressure, joining can be more certainly performed. Melt point of AuGe eutectic solder is in the vicinity of 360° C., and good junction can be obtained by holding the layers in the above-described heat treatment condition for an adequate time. Moreover, it is more preferable that joining is performed in a vacuum atmosphere because in the junction, voids are suppressed. The AuGe metal layer may be a surface of metal layer 52.

Figure 2D:
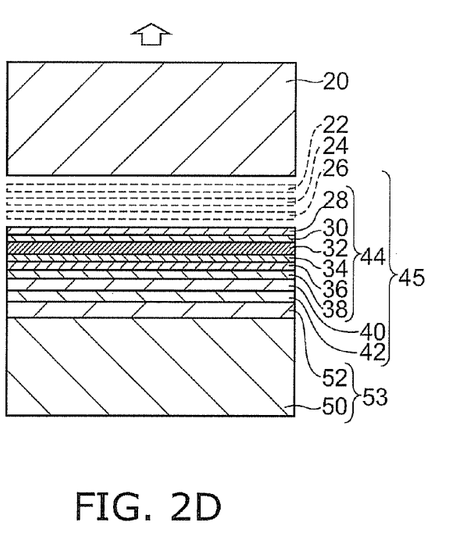

Subsequently, as shown in FIG. 2D, by using a solution etching method or a mechanical polishing method, GaP substrate 20 is detached. For example, because the etching easy layer 22 (thickness: for example, 0.5-several μm) containing Al such as AlGaP has higher etching rate than those of the GaP substrate 20 and the GaP buffer layer 24 and nitride semiconductor, if hydrochloric acid, nitric acid, or mixed solution thereof is used, the etching easy layer 22 can be easily removed.

On the other hand, the nitride semiconductor is hard. That is, in GaN, Young's modulus is about $2.9 \times 10^{11}$ N/m² which is higher than that of III-V group compound semiconductor containing no nitrogen such as GaAs or GaAlAs. Therefore, it is also easy that by using a mechanical polishing method, the first substrate 20 and the etching easy layer 22 are removed and the second substrate 50 to which the laminated body containing the light-emitting layer 32 is bonded is detached.

Subsequently, by using the mechanical polishing method or the solution etching method, the GaP buffer layer 24 and the GaN low-temperature growth buffer layer 26 are removed. The GaP buffer layer 24 and the GaN low-temperature growth buffer layer 26 does not contain Al, and therefore, can suppress oxidation and can be a nitride laminated body of good crystallinity. By containing no Al, the solution etching rate is lower than AlGaP, but generally, they are thinner than the etching easy layer 22, and therefore, can be easily removed by a solution etching or a mechanical polishing method.

If the first substrate 20 is made of GaAs, the etching easy layer 22 is made of, for example, $Al_yGa_{1-y}As$ (0<y<1), and the etching easy layer 22 can be removed, for example, by using an etching solution containing acid.

In FIG. 2D, in one side, there is a first laminated body 45 in which, a laminated body 44 that is the laminated body 39 from which the etching easy layer 22 and the GaP buffer layer 24 and the GaN low-temperature growth buffer layer 26 are removed, a transparent electrode 40, and an AuGe metal layer 42, are sequentially laminated. And, in the other side, there is a second laminated body 53, its state is that the AuGe metal layer 42 of the first laminated body 45 and the Au metal layer 52 of the second laminated body 53 are bonded.

Figure 3:
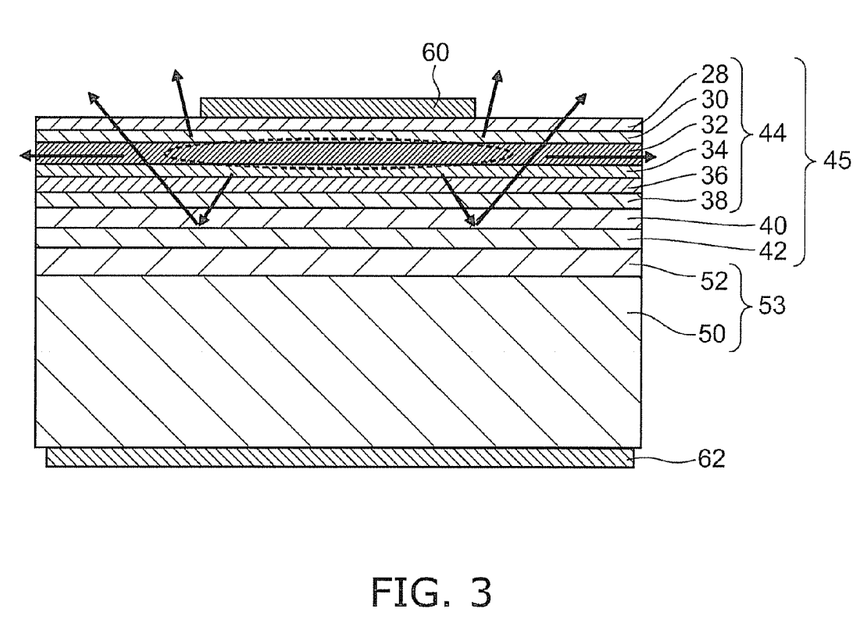
FIG. 3 is a schematic sectional view of the light-emitting device based on the first embodiment.

FIG. 3 is a schematic sectional view of the light-emitting device according to the method for producing a light-emitting device according to this embodiment. By bonding the first laminated body 45 and the laminated body 53, forming a first electrode 60 on the surface for taking out the light and forming a second electrode 62 on a back surface of the second substrate 50 and performing division into chips, a light-emitting device of FIG. 3 is produced. The light passing through the transparent electrode 40 out of the radiant light (dashed line of ellipse) from the light-emitting layer 32 is reflected by the AuGe metal layer and taken out to the outside.

The ultraviolet to green light radiated from the nitride semiconductor is absorbed to Si, and therefore, it is preferable that the first metal layer 42 made of at least AuGe metal layer or the like is provided to suppress absorption in the second substrate 50 made of Si or the like to make high light-emitting efficiency.

In the producing method of this embodiment, it is not necessary to provide the transparent electrode 40 made of ZnO or ITO. However, because an alloy of the compound semiconductor forming the laminated body 39 and Au or AuGe absorbs the radiant light and lowers the reflectance, the light-emitting efficiency can be higher as alloying is suppressed by the transparent electrode 40 to hold the reflectance to be higher.

Moreover, if n-type ZnO is used as the transparent electrode 40, low-resistance ohmic contact is formed in pn junction between the contact layer 38 and the transparent electrode 40, and therefore, the operation current flows in the vertical direction through the n-type Si substrate 50 having conductivity and the power loss is reduced, in the light-emitting device.

Figure 4A:
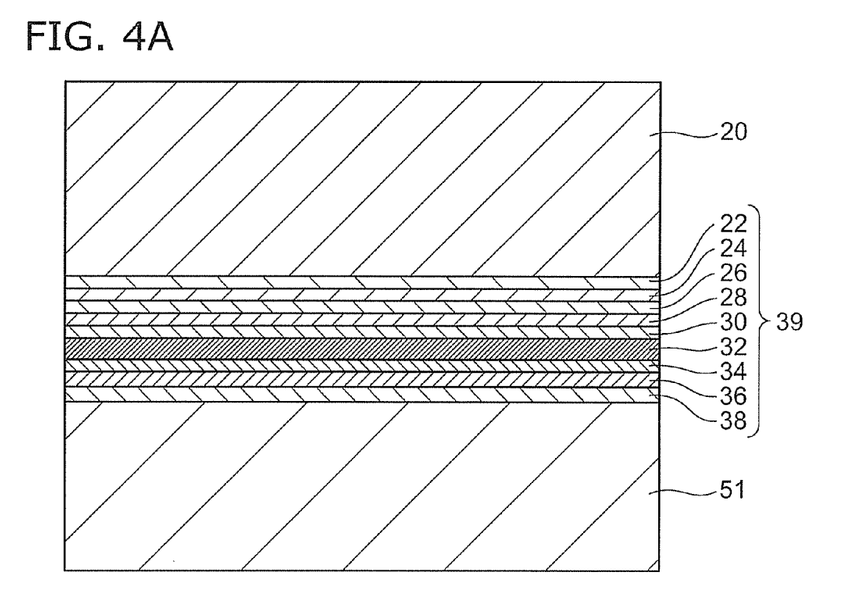
FIGS. 4A and 4B are process sectional views showing a method for producing a light-emitting device according to a second embodiment.
Figure 5:
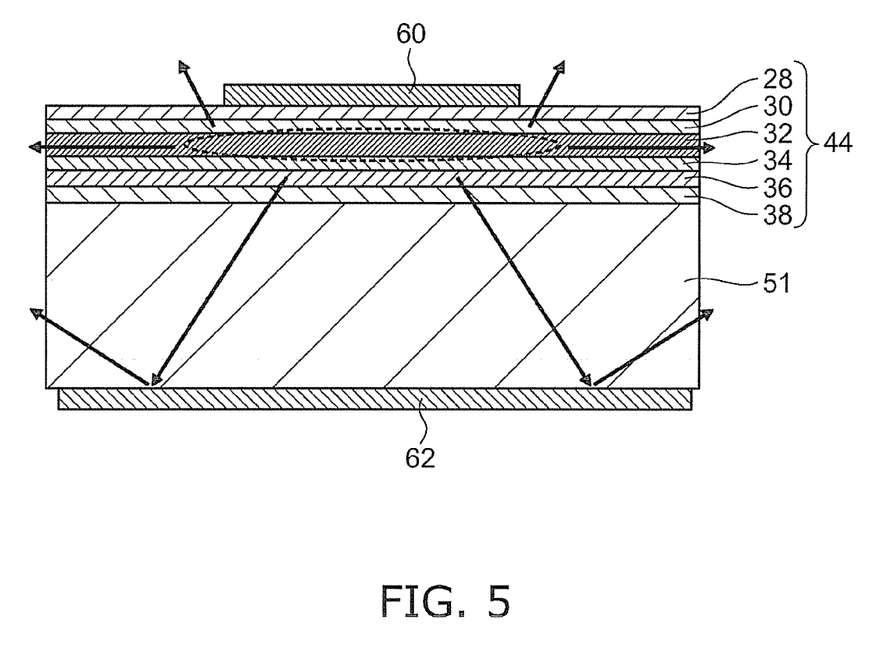
FIG. 5 is a schematic sectional view of the light-emitting device based on the second embodiment.

FIGS. 4A and 4B are process sectional views showing a method for producing a light-emitting device according to a second embodiment. Moreover, FIG. 5 is a schematic sectional view of the light-emitting device using this producing method. In FIG. 4A, the laminated body 39 formed on the GaP substrate 20 has the same structure as FIG. 2A representing the first embodiment. The contact layer 38 composing the surface of the laminated body 39 and the surface of the second substrate 51 made of n-type ZnO layer having about the same size as the GaP substrate 20 are opposed and directly bonded and heated, and thereby, joining is performed. The heat treatment condition of the junction is, for example, 600-800° C. for 1 hour. By further applying pressure, joining can be more certainly performed. In this case, it is not necessary to provide metal layers for junction on the surface of the laminated body 39 and on the surface of the second substrate 51.

In this heat treatment process, Ga composing the contact layer 38 is diffused to an n-type ZnO layer, and Zn composing an n-type ZnO layer is diffused to the contact layer 38. Therefore, it is preferable that the donor concentration of n-type ZnO is $5 \times 10^{18}$ cm⁻³ or more because depleted layer width of the pn junction becomes narrow and the tunnel current becomes large, and $5 \times 10^{19}$ cm⁻³ is more preferable. Similarly, it is preferable that the acceptor concentration of the contact layer 38 is $5 \times 10^{18}$ cm⁻³ or more, and $5 \times 10^{19}$ cm⁻³ is more preferable. As described above, this interface operates as the ohmic contact.

Figure 4B:
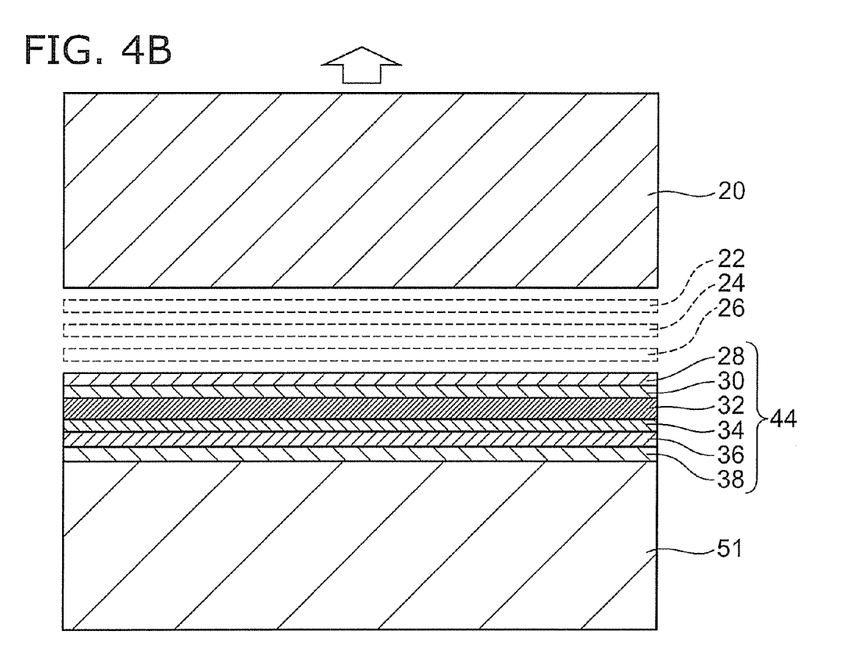

FIG. 4B is a process of detaching the GaP substrate 20. In this process, similarly to FIG. 2D representing the first embodiment, the etching easy layer 22, the GaP buffer layer 24, and the GaN low-temperature growth buffer layer 26 are sequentially removed. The state is that on the n-type ZnO, a laminated body 44 whose surface is the n-type GaN buffer layer 28 is left.

On the n-type GaN buffer layer 28, the first electrode 60 is formed, and on the back surface of the second substrate 51 made of n-type ZnO, the second electrode 62 is formed, respectively, and thereby, the light-emitting device shown in FIG. 5 is completed. Because the band gap wavelength of ZnO is about 368 nm, the radiant light from the light-emitting layer 32 is not absorbed and passed therethrough. In the second substrate 51, the light moving to the lower direction out of the radiant light (dashed line of ellipse) from the light-emitting layer 32 made of nitride semiconductor is passed therethrough, and loss is reduced by the second electrode 62 and therewith the light is reflected and passed to the above. Therefore, the light-emitting device having high light-emitting efficiency can be obtained. Because the band gap wavelength of GaP is about 550 nm, GaP absorbs the radiant light in the wavelength range of ultraviolet to green from the light-emitting layer 32.

Figure 6A:
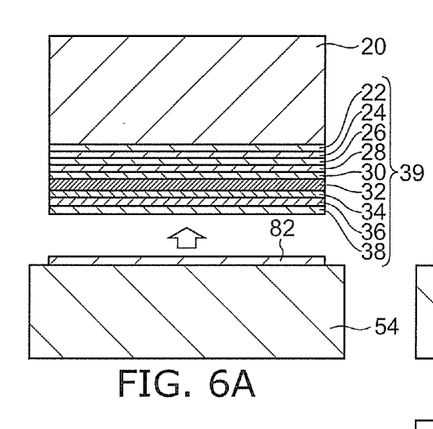
FIGS. 6A to 6F are process sectional views showing a method for producing a light-emitting device according to a third embodiment.

FIGS. 6A to 6F are process sectional views showing a method for producing a light-emitting device according to a third embodiment. The laminated body 39 on the GaP substrate 20 shown by FIG. 6A is the same as FIG. 2A. For example, an adhesive sheet 82 made of resin or the like is attached to the surface of the second substrate 54. The surface of the contact layer 38 composing the surface of the laminated body 39 and the surface of the adhesive sheet 82 are opposed and bonded.

Figure 6B:
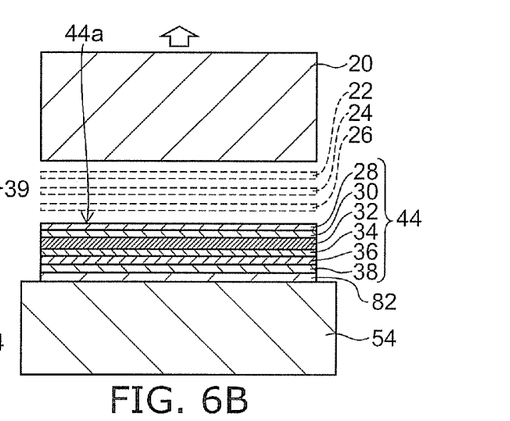

FIG. 6B shows a process of detaching the GaP substrate 20. In the same method as FIG. 2D, the etching easy layer 22, the GaP buffer layer 24, and the GaN low-temperature growth buffer layer 26 are sequentially removed. On the second substrate 54, the state is that the laminated body 44 whose one surface 44a is the n-type GaN buffer layer 28 is left.

Figure 6C:
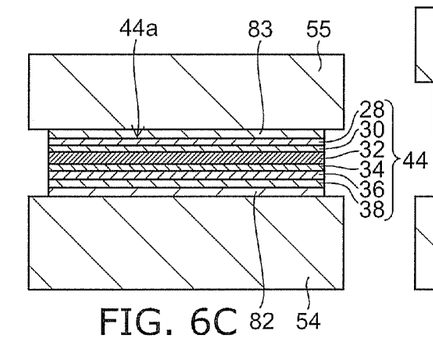

FIG. 6C shows a process of adhering a third substrate 55 made of sapphire having larger size than that of the laminated body 44 in the side from which the GaP substrate 20 is detached. That is, the surface of an adhesive sheet 83 and the one surface 44a of the laminated body 44 are opposed and bonded.

Figure 6D:
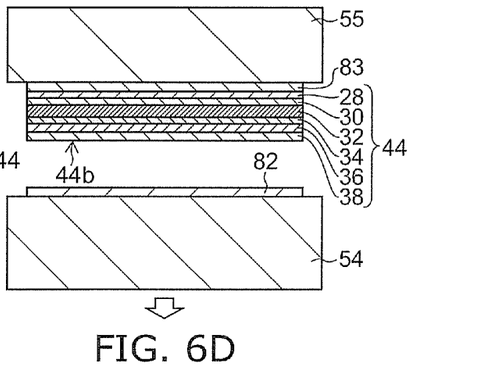

Then, as shown in FIG. 6D, the other surface 44b of the laminated body 44 and the second substrate 54 to which the adhesive sheet 82 is adhered are detached.

Figure 6E:
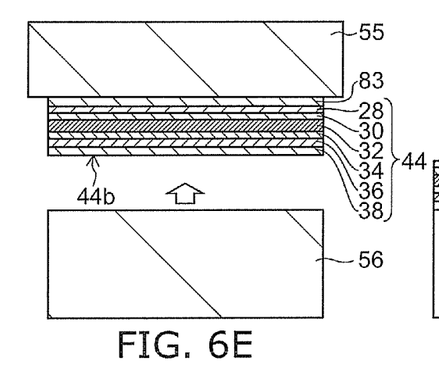
Figure 6F:
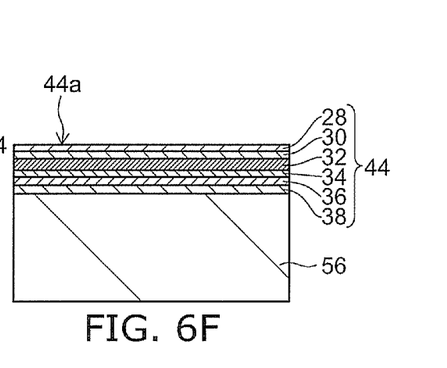

In FIG. 6E, the other surface 44b of the laminated body 44 and a fourth substrate 56 made of n-type ZnO having about the same size as the laminated body 44 are opposed and bonded and subjected to heat treatment. Furthermore, as shown in FIG. 6F, the one surface 44a of the laminated body 44 bonded to the fourth substrate 56 and the third substrate 55 to which the adhesive sheet is adhered are detached.

When crystal growth of the nitride semiconductor is performed in 1000° C. or more, an ammonium gas having high corrosion is used. It cannot be said that the ZnO substrate is robust, but the ZnO substrate is occasionally degraded. In this embodiment, without using ZnO as the substrate for crystal growth, the GaP substrate 20 is used, it is easy to suppress degradation of the substrate.

Moreover, by using a sapphire substrate as the second substrate 53, the detachment process of the GaP substrate 20 can be more certainly performed. That is, when the etching easy layer 22 such as AlGaP is etched with a solution, the n-type ZnO is occasionally etched according to acid solution. By contrast, if sapphire is used, the substrate etching with a solution can be suppressed. Moreover, when the GaP buffer layer 24 or the GaN low-temperature buffer layer 26 or the like is mechanically polished, sapphire is robust. The sapphire substrates 53 and 54 and the laminated body 44 are bonded by the adhesive sheets 82 and 83, and therefore, can be easily removed.

In FIG. 6D, when the second substrate 54 is detached, if the thickness of the laminated body 44 is sufficient, the third substrate 55 is not required, but generally, the laminated body 44 is thin and the mechanical strength is insufficient, and therefore, the third substrate 55 is used as the strengthening substrate. Eventually, for obtaining FIG. 6F, the second substrate 54 and the third substrate 55 that are made of, for example, sapphire are used and the processes increases, but the light-emitting device can be more certainly. The second and third substrates 54, 55 can be used again and the material efficiency can be improved.

The adhesive sheets 82, 83 and the sapphire substrates 54, 55 can be easily jointed by adhesive or heating, the joining process is simple. The light-emitting device that can be formed by the method for producing a light-emitting device according to the third embodiment becomes about the same as the schematic sectional view shown in FIG. 5.

Next, characteristics of the light-emitting device using the method for producing a light-emitting device according to this embodiment will be explained.

In the laminated body grown in the sapphire substrate, current flows along the substrate in the thin light-emitting layer of, for example, several µm. The sheet resistance of the thin light-emitting layer becomes high, and in 100 mA or more of operation current, heat generation becomes large and light-emitting efficiency lowers. Moreover, as the current is larger, the current more easily becomes nonuniform, and lowering of the light-emitting efficiency are more promoted with low thermal conductivity of sapphire.

By contrast, in the light-emitting device obtained by the method for producing a light-emitting device according to first to third embodiments, the current flows in the vertical direction to the substrate and therefore the serial resistance is reduced and electric power loss can be reduced. Therefore, 100 mA or more of operation current, high optical output, and high light-emitting efficiency are possible. Moreover, because the first electrode 60 and the second electrode 62 are placed above and below and the current can be flowed in the vertical direction, down-sizing of the chip becomes easy, and reduction of the price becomes possible.

As shown in FIG. 3, if the laminated body 44, the transparent electrode 40, the metal layer 42, and the second substrate 50 are sequentially laminated, alloying of the laminated body 44 and the AuGe metal layer (the first metal layer) 40 is suppressed and the reflectance in the first metal layer 40 can be enhanced and the light-emitting efficiency can be improved. In FIG. 3, the second substrate 50 is not limited to Si, and compound semiconductor is also possible.

Furthermore, as shown in FIG. 5, if the laminated body 44 is bonded to the second substrate 51 made of n-type ZnO, alloying of the second electrode 62 and the laminate body 44 can be suppressed, and the reflectance by the second electrode 62 can be held and the light-emitting efficiency can be improved.

When the light-emitting efficiency is improved and a large number of down-sized light-emitting devices are arranged, realization of a lighting apparatus having high light intensity becomes easy. For example, a white light source instead of the fluorescent material, bulb-color light sources having rich color rendering properties, a high-intensity lamp, a large-size full color display apparatus, and so forth are possible.

In this specification, "nitride semiconductor" represents a semiconductor represented by a composition formula of $B_x In_y Ga_z Al_{1-x-y-z} N$ ($0 \leq x \leq 1$, $0 \leq y \leq 1$, $0 \leq z \leq 1$, $x+y+z \leq 1$) and includes the semiconductor to which an impurity is added for controlling conductivity type.

As described above, with reference to drawings, embodiments of the invention have been explained. However, the invention is not limited to the embodiments. With respect to size, shape, arrangement, process condition, and so forth of the first substrate, the second substrate, the third substrate, the fourth substrate, the laminated body made of semiconductor, the first laminated body, the second laminated body, the adhesive sheets, the metal layers, the transparent electrode materials, and the transparent electrode which compose this invention, if design modification is performed by those skilled in the art, such modified invention is also included in the scope of this invention as long as not departing from the spirits of this invention.

The invention claimed is:

1. A method for producing a light-emitting device, comprising:
    performing, on a first substrate made of III-V group compound semiconductor, crystal growth of a laminated body including an etching easy layer contiguous to the first substrate and a light-emitting layer made of nitride semiconductor;
    forming a transparent electrode on the laminated body and a first metal layer on the transparent electrode;
    bonding the first metal layer and a second metal layer provided on a second substrate while keeping in contact and heating; and
    detaching the second substrate provided with the light-emitting layer from the first substrate by one of removing the etching easy layer by using a solution etching method, and removing the first substrate and the etching easy layer by using mechanical polishing method.

2. The method according to claim 1, wherein the transparent electrode includes one of ZnO and ITO.

3. The method according to claim 1, wherein the first metal layer includes at least one of AuGe and Au, and the second metal layer includes at least one of AuGe and Au.

4. The method according to claim 1, wherein the forming includes providing an Au layer between the transparent electrode and the first metal layer.

5. The method according to claim 1, wherein the second substrate is made of Si, the first substrate is made of GaP and the etching easy layer is made of at least one of AlGaP, InGaP, and GaAsP.

6. The method according to claim 1, wherein the second substrate is made of Si, the first substrate is made of GaAs and the etching easy layer is made of AlGaAs.

7. The method according to claim 1, wherein the second substrate is made of ZnO, the first substrate is made of GaP and the etching easy layer made of at least one of AlGaP, InGaP, and GaAsP.

8. The method according to claim 1, wherein the second substrate is made of ZnO, the first substrate is made of GaAs and the etching easy layer is made of AlGaAs.

9. The method according to claim 7, wherein a conductivity type of the ZnO is n-type.

10. The method according to claim 8, wherein a conductivity type of the ZnO is n-type.

11. A method for producing a light-emitting device, comprising:
    performing, on a first substrate made of III-V group compound semiconductor, crystal growth of a laminated body including an etching easy layer contiguous to the first substrate and a light-emitting layer made of nitride semiconductor;
    forming a transparent electrode on the laminated body;
    bonding the transparent electrode and a second substrate by using an adhesive sheet while keeping in contact and heating;
    bonding one surface of the laminated body in a side in which the etching easy layer is removed to a third substrate by using the adhesive sheet while keeping in contact and heating;
    detaching the other surface of the laminated body bonded to the third substrate from the second substrate and bonding the other surface to a fourth substrate having conductivity; and
    detaching the one surface of the laminated body bonded to the fourth substrate from the third substrate.

12. The method according to claim 11, wherein the second and third substrates are made of sapphire, respectively.

* * * * *